US011634809B2

(12) United States Patent
Kytzia et al.

(10) Patent No.: US 11,634,809 B2
(45) Date of Patent: Apr. 25, 2023

(54) METHOD AND APPARATUS FOR COATING PLASTIC BOTTLES

(71) Applicant: KHS GmbH, Dortmund (DE)

(72) Inventors: Sebastian Kytzia, Hamburg (DE); Joachim Konrad, Düsseldorf (DE)

(73) Assignee: KHS GmbH, Dortmund (DE)

( * ) Notice: Subject to any disclaimer, the term of this patent is extended or adjusted under 35 U.S.C. 154(b) by 88 days.

(21) Appl. No.: 16/314,507

(22) PCT Filed: Aug. 1, 2017

(86) PCT No.: PCT/EP2017/069476
§ 371 (c)(1),
(2) Date: Dec. 31, 2018

(87) PCT Pub. No.: WO2018/024747
PCT Pub. Date: Feb. 8, 2018

(65) Prior Publication Data
US 2019/0161855 A1 May 30, 2019

(30) Foreign Application Priority Data
Aug. 2, 2016 (DE) ...................... 10 2016 114 292.1

(51) Int. Cl.
*C23C 16/04* (2006.01)
*C23C 16/02* (2006.01)
(Continued)

(52) U.S. Cl.
CPC ............ *C23C 16/045* (2013.01); *C23C 16/02* (2013.01); *C23C 16/401* (2013.01); *C23C 16/54* (2013.01);
(Continued)

(58) Field of Classification Search
None
See application file for complete search history.

(56) References Cited

U.S. PATENT DOCUMENTS 4,505,945 A * 3/1985 Dubust .................... B05D 7/24
427/8
4,553,998 A * 11/1985 Jones ................... C03B 9/3841
65/104
(Continued)

FOREIGN PATENT DOCUMENTS

DE          10242086 A1     4/2004
DE      102006049134 A1     4/2008
(Continued)

OTHER PUBLICATIONS

KHS/Reinhold/Auinger, Frank et al., "Einigartige Losung fur Doganay I Innovation Pur" KHS-Magazin, 2014.
(Continued)

*Primary Examiner* — Karla A Moore
(74) *Attorney, Agent, or Firm* — Occhiuti & Rohlicek LLP

(57) ABSTRACT

An apparatus for coating a PET container in a coating chamber includes a lance that introduces material and energy into the container while it is in the coating chamber. This results in a reaction that coats the bottle's interior with a silicon oxide. Before reaching the coating chamber, the bottle will have passed through a cooling system connected to coating chamber. The cooling system passes cooled gas through a feed, thereby cooling said bottle before it reaches the coating chamber.

17 Claims, 2 Drawing Sheets

(51) Int. Cl.
*C23C 16/54* (2006.01)
*H01J 37/32* (2006.01)
*C23C 16/40* (2006.01)

(52) U.S. Cl.
CPC .. *H01J 37/32394* (2013.01); *H01J 37/32403* (2013.01); *H01J 37/32733* (2013.01); *H01J 37/32743* (2013.01); *H01J 37/32889* (2013.01); *H01J 37/32899* (2013.01)

(56) References Cited

U.S. PATENT DOCUMENTS

| | | | |
|---|---|---|---|
| 5,565,248 A * | 10/1996 | Plester | C23C 14/0021 427/571 |
| 6,196,154 B1 * | 3/2001 | Baumecker | C23C 14/56 118/718 |
| 6,336,775 B1 * | 1/2002 | Morita | B65G 49/065 198/721 |
| 6,368,776 B1 | 4/2002 | Harada et al. | |
| 6,565,791 B1 * | 5/2003 | Laurent | A61L 2/14 264/455 |
| 7,513,953 B1 * | 4/2009 | Felts | C23C 14/046 118/715 |
| 8,910,396 B1 * | 12/2014 | Burchell | F26B 21/004 431/328 |
| 2003/0232150 A1 * | 12/2003 | Arnold | B29C 49/421 427/569 |
| 2005/0127843 A1 * | 6/2005 | Koulik | B65B 55/10 315/111.01 |
| 2006/0078675 A1 | 4/2006 | Kumar et al. | |
| 2006/0172085 A1 | 8/2006 | Kobayashi et al. | |
| 2007/0254096 A1 * | 11/2007 | Hepper | B08B 7/00 427/237 |
| 2009/0061111 A1 * | 3/2009 | Mishima | C23C 16/44 427/589 |
| 2009/0148633 A1 * | 6/2009 | Inagaki | B05D 1/62 428/34.1 |
| 2009/0280268 A1 * | 11/2009 | Glukhoy | C23C 16/509 427/578 |
| 2009/0284421 A1 | 11/2009 | Glukhoy et al. | |
| 2009/0304950 A1 | 12/2009 | Rostaing | |
| 2010/0298738 A1 * | 11/2010 | Felts | B65D 25/14 600/576 |
| 2014/0102639 A1 * | 4/2014 | Nettesheim | H01J 37/32357 156/345.28 |
| 2016/0240722 A1 * | 8/2016 | Heng | B01D 53/14 |

FOREIGN PATENT DOCUMENTS

| | | | |
|---|---|---|---|
| DE | 102011050015 A1 | 10/2012 | |
| DE | 102011050016 A1 | 10/2012 | |
| EP | 2 020 390 | 2/2009 | |
| EP | 2113368 A2 | 11/2009 | |
| EP | 2 216 160 | 8/2010 | |
| FR | 3034434 A1 * | 10/2016 | ........ H01J 37/32403 |
| JP | 2012149334 A | 8/2012 | |
| WO | WO-9633955 A1 * | 10/1996 | .......... C03C 17/005 |
| WO | 01/25503 A1 | 4/2001 | |
| WO | WO2010/046072 | 4/2010 | |
| WO | WO2013/004440 | 1/2013 | |

OTHER PUBLICATIONS

Gajda I KHS, Jaroslaw, "Innopet Plasmax-Beschichtungstechnologie—Qualitativ und ökonomisch klar im Vorteil" Produkte, Technik & Technologien I Getränke!, März. 2014.

KHS GmbH, "KHS bringt multifunktionalen Anlagenblock für die PET-Verarbeitung zur Marktreife" KHS-Magazin, Feb. 16, 2016.

KHS GmbH, "KHS InnoPET BloFill—Energieeffiziente Streckblas-Füll-Verschließ-Technik", [gefunden14.03.2022]Fundstelle:[https://www.youtube.com/watch?v=6TR9M7xZYsU].

* cited by examiner

METHOD AND APPARATUS FOR COATING PLASTIC BOTTLES

RELATED APPLICATIONS

This application is the national stage of international application PCT/EP2017/069476, which claims the benefit of the Aug. 2, 2016 priority date of German application DE 102016114292.1, the contents of which are herein incorporated by reference.

FIELD OF INVENTION

The invention concerns container processing, and in particular, coating the inner wall of a plastic container with a silicon oxide.

BACKGROUND

Plastic offers a useful alternative for making containers. It is light, inexpensive, and easy to mold. However, a difficulty that can arise is the possibility of plasticizing agents migrating into the beverage.

To avoid this difficulty, it is known to coat the interior walls of the container with a suitably inert material that blocks such migration. A known material is a silicon oxide, and in particular, silicon dioxide. This can be applied by glow discharge procedure.

SUMMARY

The invention provides a way to apply a silicon coating to a container's interior by directing ions at the container's inner wall. When these ions hit the wall at high velocity, the coating can grow rapidly and densely. However, the high kinetic energy of these ions must be absorbed as they hit the wall and come to a stop. The wall absorbs this kinetic energy and releases it again as heat. This raises the wall's temperature. In the case of a polyethylene terephthalate bottle, if the temperature rises past about 60° C.-65° C., the wall can start to deform permanently.

The invention provides a way to actively cool a container so that the heat generated during the deposition process does not raise the container's temperature high enough to risk deformation. This is carried out by cooling the container immediately before coating and/or before causing a vacuum in the coating chamber.

In one aspect, the invention includes cooling the container so that the container's temperature is low enough to ensure that the energy imparted to the container by the fast-moving ions will not be insufficient to raise the temperature to the point at which permanent deformation will result. For a typical plastic, cooling the temperature to about 30° C. and in particular below 28° C. will permit coating without the container's temperature rising past 60° C.

The method relies on a gas as a cooling medium, and in particular, on air. Some embodiments feature a lance that can be introduced into a container to deliver gas to the container's interior as well as to a volume surrounding the container, thus enabling the container to be cooled from both the inside and the outside.

Some practices also feature extracting moisture from the cooling medium using a climate-control system, such as an air conditioner. In such cases, a moisture content of less than 30%, and in particular, less than 20%, is helpful for improving the quality of the coating.

This preconditioning of the bottle by controlling its initial temperature takes place over a defined path that the container traverses on its way to a coating chamber. Such a path includes an air-delivery segment, or cooling segment, along with something that moves the containers, such as a conveyor belt. The arrangement of the climate-control system is such that no condensate forms on the surface of the container. This means that cooling takes place with high enough air flow at a moderate temperature, such as 20° C. to 30° C., which is only slightly below the target preconditioning temperature of between 28° C. and 30° C.

Further embodiments cool a container-receiver in the coating chamber to avoid condensation on any guide elements of the coating system. In some embodiments, the container receiver is a wheel, such as a coating wheel or a receiver wheel.

Some embodiments cool containers just before transferring or while transferring them into the coating chamber. Further embodiments include cooling the container while it is already in the coating chamber.

Further embodiments feature cooling the container using cooled air delivered to the transport path as the container is making its way to the coating chamber. Among these embodiments are those that rely on an air conveyor to actually push the containers along the path using blown air. This is particularly advantageous since the blown air is carrying out two functions at once: providing kinetic energy for moving the container and also cooling it.

Further practices include ensuring that the cooling medium, whether it be cooled air or some other cooled gas, is free of foreign substances, such as dust.

In other embodiments, a gas-drying unit, dehumidifier, climate-control system, or air-conditioner adjusts the moisture content of the cooling medium.

In some embodiments, the preconditioning of bottles takes place using air that is only slightly cooler than a target temperature. To ensure sufficiently rapid heat transfer, one compensates for the low temperature differential by having the air move past the container at very high volume rates of flow or flow velocities.

The use of only a small temperature difference avoids the risk of the container's temperature falling below the dew point and thus causing condensation. For example, if the container is intended to be at 30° C. upon the beginning of the coating procedure, cooling takes place at a temperature no more than 10° below this target temperature or no more than 5° C. below this target temperature.

In some embodiments, it is possible to use the same cooling system that cools the coating chamber to also cool the containers as they make their way towards the coating chamber, thus eliminating the need for a separate cooling system.

Some embodiments reduce entry of fresh air by at least partially enclosing the cooling segment and/or the coating chamber, for example by placing them in a common housing. This enables climate-control conditions to be defined more precisely to ensure that the container arrives at the coating chamber at precisely the right temperature, thus reducing energy consumption required for any further cooling of the container at the coating chamber.

In some embodiments, containers are conveyed to the coating chamber while suspended by neck rings thereof instead of standing on their bases. Among these embodiments are those in which an air-conveyor creates a conveying air stream that essentially blows the containers towards the coating chamber. This blown air thus carries out the dual functions of moving the containers and cooling them.

In some embodiments, some of the air flow that would otherwise be used to push the containers along is diverted to enter the container's interior, thus cooling the interior as well as the exterior of the container at the same time.

A method and apparatus as described herein thus provides a way to cause a lightweight container, such as a polyethylene terephthalate bottle, to have an effective barrier made of an oxide of silicon on its interior wall.

Some embodiments carry out cooling within an enclosed or encapsulated cooling segment that is upstream of the coating chamber. This means that the temperature and humidity of the cooling air can be adjusted precisely without significant interference from the ambient air conditions. As a result, it is possible to avoid condensation on the container and to also ensure that the container enters the coating chamber at a low enough temperature so that the final temperature at the end of the coating process is still below the temperature at which deformation is likely to occur.

In some embodiments, the cooling segment also transports the containers towards and into the coating chamber. This makes it simpler to cool down the containers slowly, thereby reducing the risk of having the container's temperature dip below the dew point.

In some embodiments, containers rest on their bases on a conveyor belt as they are transported to the coating chamber. In such embodiments, it is useful to also cool the bases of the containers as they are being transported.

Some embodiments include a temperature sensor, and in particular, a contactless sensor, to permit a controller to control the cooling process based in part on a measured temperature. Other embodiments also include a humidity sensor to measure humidity of air near the container so that the cooling process can also be controlled based in part on measured humidity. Doing so provides a way to reduce the risk of condensation occurring on the container, on the transport path, or in the coating chamber.

The ability to measure temperature also permits the controller to take into account ambient conditions. For example, if the air is particularly warm, the bottle's temperature upon entry into the apparatus will be higher. By knowing the temperature and humidity, the controller will be able to further cool or dehumidify the cooling medium or increase its flow velocity as needed to ensure that the container arrives at the coating chamber at a suitable temperature for coating and sufficiently dry for effective coating to be carried out.

In another aspect, the invention features a coating system having a coating chamber for coating the interior wall of a polyethylene terephthalate bottle with an oxide of silicon. The coating system includes a plasma-generating system that uses a coating lance to apply a coating material to the container's interior wall. The plasma-generating system applies energy to cause a coating material present on a target to vaporize into ions, thus creating a conducting gas. In some embodiments, the conducting gas is a plasma. An electric field is thus able to accelerate the ions toward the inner wall of the container. This electric field can thus be regarded as causing an electrical discharge.

Among the embodiments are those in which there exists a container-cooling system or a cooling segment that connects to the coating chamber. This allows the container's temperature upon commencement of coating to be maintained below a particular limit temperature. In a preferred embodiment, the coating chamber and the cooling system connect directly to each other, thereby avoiding or reducing the risk of having the temperature rise to the point at which the container begins to deform.

In a preferred embodiment, there exists a device that cools a gas, such as air. This device can also include dehumidify the air up to a desired level of humidity. There also exists a way to deliver the conditioned gas to the containers. This enables the containers to be cooled to a temperature low enough so that the heat that results from the coating process is insufficient to deform the container.

In some embodiments, there exists a lance that delivers cooling medium into the container so that its interior wall can be cooled.

In some embodiments, a housing encloses both the coating chamber and a cooling segment. In these embodiments, there exists a suitable transfer element that moves the container from the cooling segment and into the coating chamber.

Certain embodiments have a cooling system that maintains the gas pressure inside a housing so that it is slightly higher than ambient pressure outside the housing. This suppresses any tendency for unconditioned outside air to enter the cooling segment. As a result, warm or humid air from the outside is barred from entering, thus promoting the ability to maintain the cooling medium at a desired temperature and humidity.

Certain embodiments also feature a climate-control system that extracts moisture from the cooling gas, thereby avoiding or reducing the risk of condensation on containers.

Some embodiments feature a temperature sensor in the coating chamber or just upstream of the coating chamber so that the container's temperature can be measured just before commencement of coating. A control system receives this temperature measurement and uses it in connection with controlling the cooling system. Thus, if the ambient temperature is particularly high, the controller will recognize a higher cooling load and thus cause the cooling system to cool more aggressively or vice versa.

Some embodiments feature a moisture sensor in the coating chamber or just upstream of the coating chamber so that the container's moisture level can be measured just before commencement of coating. A control system receives this moisture measurement and uses it in connection with controlling the cooling system. Thus, if the ambient humidity is particularly high, the controller will recognize a higher dehumidifying load and thus cause the cooling system to dehumidify more aggressively or vice versa.

In some embodiments, the cooling medium also provides the motive force to move the containers towards the coating chamber as they are being cooled. Among such embodiments are those that suspend the containers from their neck rings.

Some embodiments feature side walls on both sides of the transport path that function as gas conveyors by guiding cooling medium so that it cools the sides and bottoms of containers as they are transported. Such side walls can be configured with gas channels having appropriate outlets or gas lines and/or nozzle elements that open out from the side walls.

In some embodiments, the cooling segment forms a tunnel that encloses containers on four sides.

BRIEF DESCRIPTION OF THE DRAWINGS

The invention is now described on the basis of the schematic drawings. These show.

DETAILED DESCRIPTION

Figure 1:
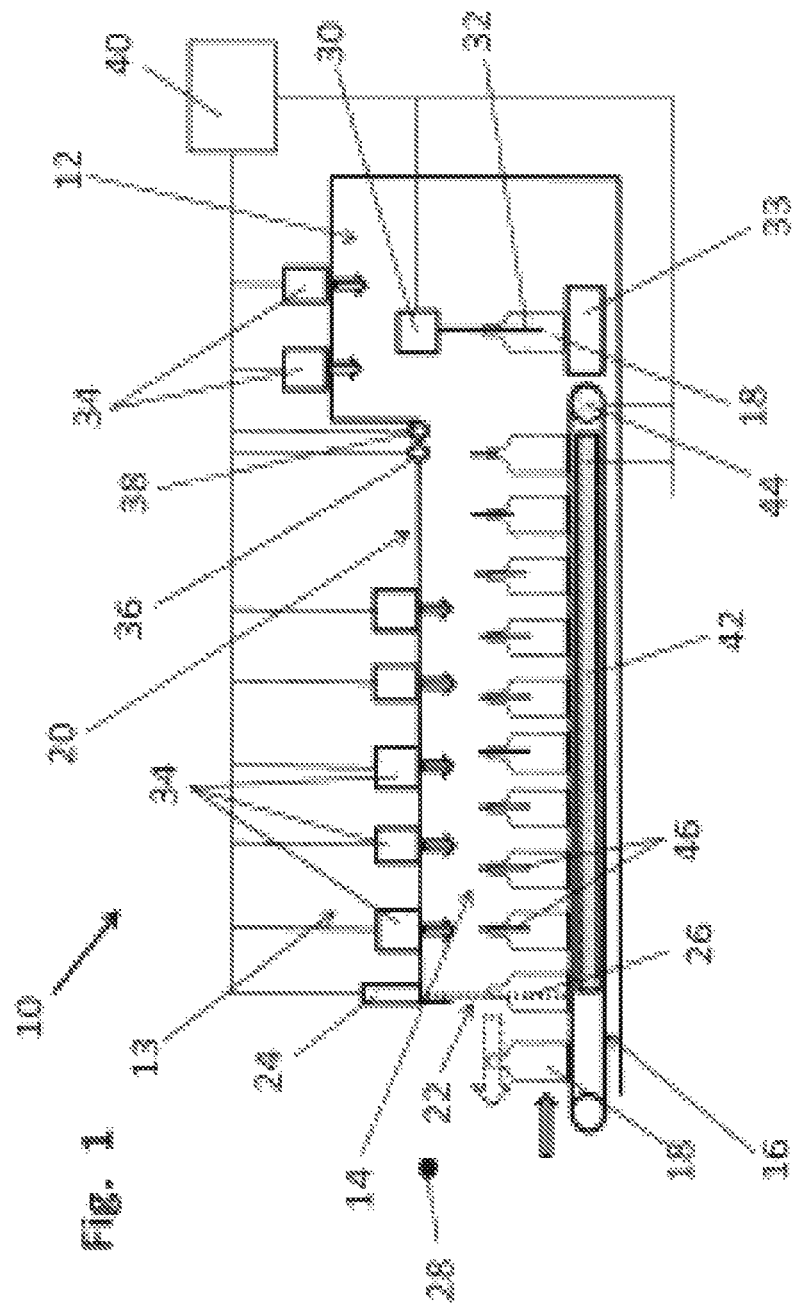
FIG. 1 A coating system with a container cooling system, with conveyor belt, and FIG. 2 a coating system in accordance with FIG. 1, but with an air conveyor for the containers in the container cooling system.

Referring to FIG. 1, a coating system 10 for coating containers 18 includes a housing 20 that houses both a coating chamber 12 and a cooling system 13 that is next to the coating chamber 12. The cooling system's inlet 22 forms the only opening into or out of the housing 20. In a typical embodiment, the containers 18 are polyethylene terephthalate bottles.

The cooling system 13 includes a cooling segment 14 along which containers 18 travel on a conveyor belt 16 driven by a drive motor 44. In some embodiments, a cooling device 42 within the conveyor belt 16 cools the containers' bases. A controller 40 controls both the cooling device 42 and the drive motor 44.

In the illustrated embodiment, a gas-nozzle arrangement 25 at the inlet 22 forms a gas screen 26 that separates the cooling segment 14 from ambient air 28. In those cases in which the pressure within the coating chamber 12 or the cooling segment 14 exceeds the pressure in the ambient air 28, no gas-nozzle arrangement 24 is needed.

Within the coating chamber 12, a plasma generator 30 connects to a plasma lance 32 that is introduced into a container 18 held at a container-receiver 33, such as a receiver wheel that supports a container in the coating chamber 12. In some embodiments, the container-receiver 33 is one that can be cooled separately.

The coating system 10 also includes air feeds 34 that connect to a cooling device. These air feeds 34 direct cooled air to the coating chamber 12 and to the cooling segment 14. In some embodiments, the cooling device is a climate-control device that draws moisture from the cooled air as well.

The controller 40 also connects to a temperature sensor 36 at the inlet of the coating chamber 12. The temperature sensor 36 determines the container's temperature immediately before that container 18 is to be coated and provides that temperature to the controller 40. A suitable temperature sensor 36 is an infrared sensor.

The controller 40 also connects to the feeds 34 and to the plasma generator 30. As a result, it is possible to regulate the cooling air's temperature in response to signals from the temperature sensor 36.

In some embodiments, the controller 40 also receives signals from a moisture sensor 38 that determines the container's moisture content immediately before coating that container 18. As a result, in those cases that use a climate-control device, is also possible for the controller 40 to also regulate the moisture content of incoming cooling air to achieve a pre-determined humidity.

Movable lances 46 connected to the cooling device can be lowered into containers 18. These lances 46 deliver cooled air at a particular temperature and humidity into the container 18. As a result, the cooling system 13 cools the containers 18 from both the inside and the outside. This ensures that, at the beginning of the coating process, the container 18 has the correct temperature.

The control unit 40 actuates the feeds 34 to raise pressure in the cooling segment 14 higher than pressure in the ambient air 28. Due in part to the gas screen 26, this causes cooler air to escape from the cooling segment 14, as indicated by the arrow, through the cooling segment's inlet 22 and into the ambient air 28. This also suppresses entry of ambient air 28, which may bring with it incorrect temperature or humidity, into the cooling segment 14. As a result, the coating system 10 results in a high-quality coating that is largely independent of conditions prevailing in the ambient air 28. This means that the coating system 10 can be used effectively in areas with high humidity and temperature.

Figure 2:
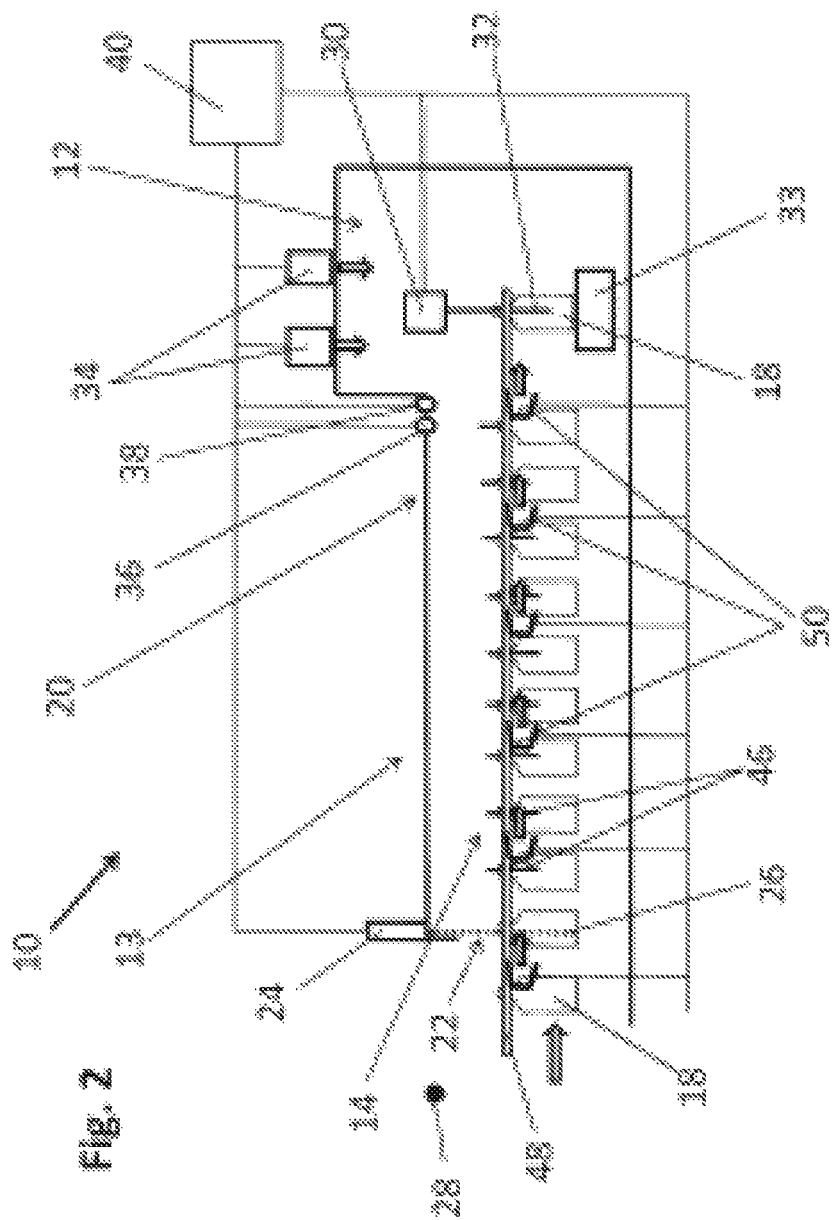

In an alternative embodiment, shown in FIG. 2, neck-ring guides 48, which suspend containers 18 from their neck rings, replace the conveyor belt 16. Additionally, an air-conveyor system 50 uses a flow of cooled air to convey the containers 18 towards the coating chamber 12. The air-conveyor system 50 blows air against the entire container 18.

Some embodiments that rely on the air-conveyor system 50 also includes feeds 34 as shown in FIG. 1 to create a slight overpressure in the cooling segment 14. Other embodiments that rely on the air-conveyor system 50 also rely on lances 46 as shown in FIG. 1 to cool containers' interiors.

The controller 40 connects to the air-conveying system 50 and thus provides control over it in response to a signal from a temperature sensor 48 and in some cases, a moisture sensor 38.

In some embodiments, the air-conveyor 50 includes decentralized components of a cohesive air-guidance device that extends along the cooling segment 14 and that is connected to a common cooling system 13, such as a climate-control system or air-conditioner.

In some embodiments, the coating chamber 12 is closed so that a vacuum can be formed within. In other embodiments, the coating chamber 12 is on a coating-wheel that rotates during production.

The invention is not restricted to the exemplary embodiment described heretofore, but can be varied within the scope of protection of the claims hereinafter.

The invention claimed is:

1. An apparatus comprising a coating chamber, an enclosed cooling segment upstream of said coating chamber, a cooling-gas device for cooling a cooling gas that is provided for cooling a polyethylene terephthalate bottle, an air feed, and a first lance that introduces material into a bottle in said coating chamber and introduces energy into said material to cause a reaction that results in coating of an oxide of silicon on an interior wall of said bottle, which is in said coating chamber, wherein said cooling segment is connected to said coating chamber such that said bottle passes through said cooling segment on its way to said coating chamber and wherein cooled gas that is passed through said air feed into said enclosed cooling segment cools said bottle before said bottle has reached said coating chamber, said apparatus further comprising an air-conveyor system for causing an air flow that propels the bottle toward said coating chamber, said air flow comprising air that has been cooled by said cooling-gas device.

2. The apparatus of claim 1, wherein said air-conveyor system comprises neck-ring guides.

3. The apparatus of claim 1, further comprising a receiver wheel in said coating chamber, wherein said receiver wheel rotates said bottle in said coating chamber during production.

4. The apparatus of claim 1, further comprising a gas nozzle arrangement at an inlet of said cooling segment, wherein said gas nozzle arrangement is configured to form a gas screen.

5. The apparatus of claim 1, further comprising a moisture sensor for obtaining a measurement of moisture content within said bottle prior to coating said inner surface of said bottle and using said measurement of moisture content for controlling moisture content of cooled gas that is to be used for cooling said bottle.

6. The apparatus of claim 1, wherein said cooling segment has, as an intended use, that of cooling said bottle to a temperature that is below 30° C., and wherein said cooling segment is configured to cool said bottle to a temperature that is below 30° C.

7. The apparatus of claim 1, wherein said air feed has, as an intended use, that of cooling said bottle both from inside and outside said bottle, and wherein said air feed is configured to cool said bottle both from inside said bottle and from outside said bottle.

8. The apparatus of claim 1, further comprising a housing that connects said coating chamber and said cooling segment, wherein said housing comprises an inlet and wherein said inlet is the only opening into or out of said housing.

9. The apparatus of claim 1, wherein said air feed comprises movable lances that are all connected to receive cooled gas, said movable lances being configured to be raised and lowered for delivering cooled air at a particular temperature and humidity into corresponding bottles, one of which is said bottle.

10. The apparatus of claim 1, further comprising a second lance, wherein said second lance is connected to said air feed for introducing cooled gas into said bottle.

11. The apparatus of claim 1, further comprising a housing, wherein said housing surrounds said coating chamber and said cooling segment, and wherein said housing connects said coating chamber and said cooling segment.

12. The apparatus of claim 11, wherein said cooling segment is configured to expose an exterior surface of said bottle to gas that has been cooled by said cooling segment.

13. The apparatus of claim 1, further comprising a housing that contains said coating chamber, wherein a pressure of said cooling gas within said housing is maintained above ambient pressure.

14. The apparatus of claim 1, wherein said gas-cooling device is further configured to reduce moisture content of gas used for cooling the bottle.

15. The apparatus of claim 1, further comprising a controller and a temperature sensor, wherein said controller is configured to control said cooling segment, said cooling-gas device, and said air feed in response to a signal provided by said temperature sensor, said signal being indicative of a temperature of said bottle.

16. The apparatus of claim 1, further comprising a receiver wheel in said coating chamber, wherein said receiver wheel supports said bottle in said coating chamber.

17. A method comprising using an apparatus comprising a coating chamber, an enclosed cooling segment upstream of said coating chamber, a cooling-gas device for cooling a cooling gas that is provided for cooling a polyethylene terephthalate bottle, an air feed, and a first lance that introduces material into a bottle in said coating chamber and introduces energy into said material to cause a reaction that results in coating of an oxide of silicon on an interior wall of said bottle, which is in said coating chamber, wherein said cooling segment is connected to said coating chamber such that said bottle passes through said cooling segment on its way to said coating chamber and wherein cooled gas that is passed through said air feed into said enclosed cooling segment cools said bottle before said bottle has reached said coating chamber, wherein using said apparatus comprises cooling said bottle within said enclosed cooling segment while transporting said bottle toward said coating chamber, immediately after having cooled said bottle and transported said bottle to said coating chamber, forming a plasma, creating an under-pressure, and coating an inner surface of said bottle with an oxide of silicon, said method further comprising causing an air flow that propels the bottle toward said coating chamber, said air flow comprising air that has been cooled by said cooling-gas device.

* * * * *